Feb. 14, 1967 R. ZULEEG 3,304,471
THIN FILM DIODE
Filed Jan. 28, 1963

Rainer Zuleeg,
INVENTOR.

BY.

W Hlue Allister Jr.

ATTORNEY.

United States Patent Office 3,304,471
Patented Feb. 14, 1967

3,304,471

THIN FILM DIODE

Rainer Zuleeg, Newport Beach, Calif., assignor to Hughes Aircraft Company, Culver City, Calif., a corporation of Delaware Filed Jan. 28, 1963, Ser. No. 254,209
4 Claims. (Cl. 317—237)

This invention relates to an asymmetrical conducting device. More particularly, the invention relates to a thin-film solid state electrical device for current rectification and high frequency mixing.

Diodes of the type to which the present invention appertains are known as thin film diodes. As used herein, the phrase "thin film diode" is intended to mean an asymmetrical device composed of a thin film of a semi-insulator material having a pair of electrodes in contact therewith whose work functions are, respectively, higher and lower than the work function of the semi-insulator material. Such a device is asymmetrically conductive because current can flow easily therethrough in only one direction. Thus, with a positive potential on the high work function electrode (or the anode) and a negative potential on the low work function electrode (or cathode), electrons enter into the conduction band of the insulator at the cathode and "drift" under the influence of the applied field across the semi-insulator to reach the anode and exist as conduction electrons into the metal. In the reverse bias condition, with the cathode positive and the anode negative, none or only small leakage currents will flow, since the higher work function material sets up a "barrier" for electron transition into the semi-insulator. Under certain high fields, electrons can surmount this barrier and current can be drawn according to the law of "Schottky high field emission."

Heretofore, solid state asymmetrically conductive devices have been fabricated of semiconductor materials such as germanium or silicon in which there are available charge carriers for conduction and wherein P-N junction is provided between regions of opposite conductivity, it being merely necessary to cause the injection of these charge carriers across this junction. Because injection across the junction is relatively easy in one direction and not in the other, these prior art semiconductor devices also conduct current asymmetrically.

Under the impetus of the desire and need to provide smaller and lighter electrical and electronic components, much effort has been expended to provide solid state electrical components in the form of extremely thin films usually disposed upon an insulating substrate. However, the prior art semiconductor devices do not lend themselves readily to thin-film structures and processes, particularly because of the necessity of utilizing semiconductor materials in their single crystalline structure and providing therein a rectifying junction between regions of opposite conductivity to which electrical connections must be made.

It is therefore an object of the present invention to provide an improved solid state asymmetrically conducting device.

Another object of the invention is to provide a thin-film diode device.

These and other objects and advantages of the invention are realized according to the present invention by providing a device comprising a thin film of a semi-insulator material having a pair of metal electrodes in contact with different portions thereof, one electrode having a work function higher than the work function of the semi-insulator and the other electrode having a work function lower than the work function of the semi-insulator. The semi-insulator is of single crystalline structure and has a resistivity of at least $10^4$ ohm-centimeters, and a thickness of less than twenty microns. The device of the invention is preferably formed by vacuum deposition techniques including the metal electrodes as will be more fully explained hereinafter.

The invention will be described in greater detail by reference to the drawings in which.

Figure 1:
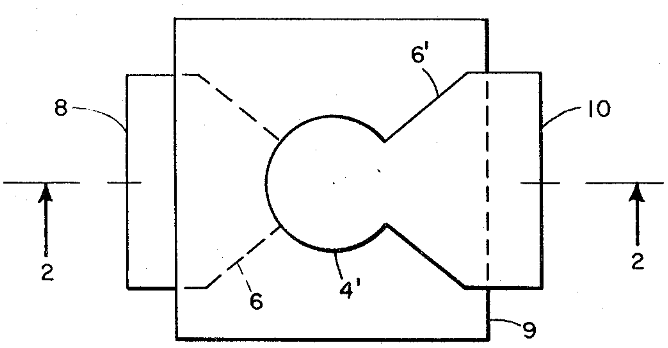
FIGURE 1 is a plan view of a thin-film diode according to the invention.
Figure 2:
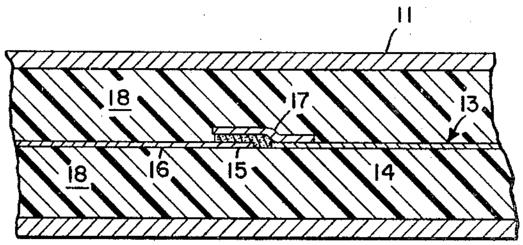
FIGURE 2 is an elevational view in section of the diode shown in FIGURE 1.

Referring now to the drawings, an insulating substrate 2 of glass or the like is disposed in vacuum deposition apparatus with a mask positioned on the surface of the substrate and having an opening therein corresponding to the desired shape of an electrode to be formed. As shown in FIGURE 1 the electrode shape may be that of a keyhole having a small circular portion 4 integral with a substantially larger leg portion 6 for convenience in making electrical connections to the device. In the deposition process for forming such an electrode, it will be understood that the mask opening will have a shape corresponding thereto. The metal for the electrode 8 is then evaporated and deposited onto the substrate 2 through the opening in the mask. Thereafter the electrode-forming mask is removed and a second mask having a substantially square aperture therein is positioned on the substrate so that the aperture is substantially centered with respect to the circular portion 4′ of the thin film electrode 8 previously formed. The mask aperture is large enough so as to expose not only the circular portion of the electrode 8 but also adjacent portions of the substrate, particularly those portions extending away from the leg portion 6′ of the electrode. A thin film 9 of a semi-insulator material such as cadmium sulfide is then formed by evaporation and deposition through the mask opening upon the circular portion 4′ of the electrode 8 and upon the exposed substrate. Thereafter the mask is removed and replaced by the mask utilized for forming the first electrode but so positioned as to have the circular portion centered over the circular portion of the electrode 8 with the leg portion of the mask aperture extending away from the direction of the leg portion 6′ of the electrode 8. The metal for forming a second electrode 10 is then evaporated and deposited onto the thin-film insulator 9 and exposed portions of the substrate 2. In this manner a thin film of insulator material may be disposed between the electrodes and the electrodes may be electrically isolated from each other, the semi-insulator achieving such isolation where it extends over and beyond the electrode 8.

According to the present invention, the metal forming the first electrode 8 may be such as to have a work function higher than that of the semi-insulator film 9 and the metal forming the second electrode 10 should be such as to have a lower work function than that of the semi-insulator film. Thus these conditions may be achieved by forming the first electrode 8 of gold, for example, and by forming the second electrode 10 of indium, for example. The work functions of gold and indium are, respectively, 4.8 *e*V and 3.8 *e*V, while the work function of the cadmium sulfide is 4.2 *e*V. Other satisfactory electrode metals which may be employed are: aluminum, silver, gallium, tellurium, and cadmium. The semi-insulating material may be disposed between the electrodes and the electrodes may be thereby electrically isolated from each other, the semi-insulator achieving such isolation where it extends over and beyond the electrode 8.

The semi-insulator layer 9 should be less than twenty microns thick, preferably around ten microns, and may be formed by vacuum depositing cadmium sulfide through a mask as described previously. In order to obtain a film of controllable and uniform thickness a preferred method for vacuum depositing the film 9 is by disposing the substrate and source of cadmium sulfide in such a manner as to require evaporated particles from the source to have one or more collisions with some surface other than the substrate prior to deposition upon the substrate. Such a process is fully described in my copending application, S.N. 241,854, filed December 3, 1962, and assigned to the instant assignee. The semi-insulator film deposited by this method is found to be single crystalline and to have a resistivity greater than $10^4$ ohm-centimeters and therefore satisfactory for use as a semi-insulator in the diode device of the invention.

Other semi-insulator materials which may be utilized according to the present invention are compounds formed by elements of the Second and Sixth Columns of the Periodic Table according to Mendeleev as well as compounds formed by elements of the Third and Fifth Columns of this Periodic Table. Some of the more preferable semi-insulator materials in addition to cadmium sulfide are: cadmium telluride, cadmium selenide, zinc sulfide, zinc selenide, zinc telluride, gallium arsenide, gallium phosphide, indium arsenide, indium phosphide, and indium antimonide. These materials are preferred primarily because of their more advantageous physical properties among which are thermal stability and ability to be vapor-deposited and plated with a metal.

The thin film diode of the present invention is characterized by having little or no spreading series resistance. In prior art devices the contact to the semiconductor or semi-insulator material invariably involved a resistance which is known as the "spreading series" resistance since it would spread or increase with increasing current. The absence of such spreading series resistance in the thin film diode of the present invention makes this diode extremely important and useful for frequency mixing purposes, since the diode will not introduce losses due to such series resistance. Such parasitic losses in prior art devices causes distortion or loss of signal strength.

A thin film diode of the present invention is also useful in frequency generation applications where it functions as a variable reactance. The capacitance of the diode of the present invention is a function of the voltage and has a unique non-linearity which permits harmonic generation.

Another important property of the thin film diode of the present invention is the absence of a "built-in" voltage which absence permits operation of the present diode with a rapid current increase near zero bias. It will be understood that in prior art devices it is necessary to apply a significant bias at least greater than the built-in voltage in order to permit such current increase.

It has also been found with thin film diodes fabricated according to the present invention that charge carriers including both holes and electrons may be injected by the respective electrodes. This is significant because it permits operation of the device as a current-controlled negative resistance. This negative resistance is realized in the thin film diode of the present invention because of the high crystal perfection and the thinness of the semi-insulator film utilized. Lifetimes for holes and electrons are attained thereby which are appreciably higher than the lifetimes obtained with prior art evaporated thin films. In the cadmium sulfide thin film diode described herein a lifetime of $10^{-9}$ seconds for holes has been observed, for example.

Figure 3:
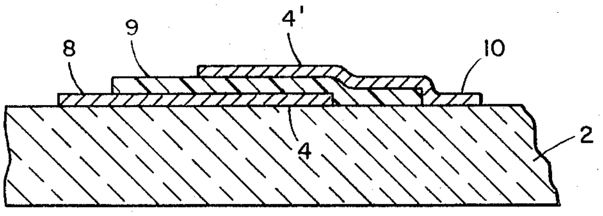
FIGURE 3 is an elevational view in section of the diode of the present invention in combination with a high frequency transmission line.
Figure 4:
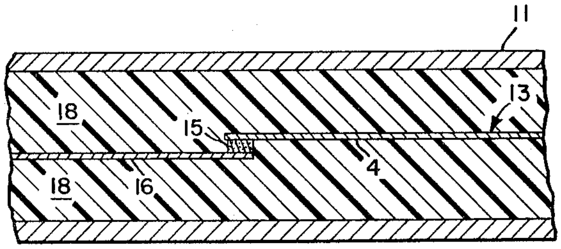
FIGURE 4 is an elevational view in section of the diode of the invention in an alternative combination with a high frequency transmission line.

Referring now to FIGURES 3 and 4, a combination of a thin film diode according to the present invention with a transmission line is shown. It is desirable to combine a diode device with a high frequency transmission line for frequency mixing purposes in such a manner as to avoid the necessity of opening up the transmission line which would cause losses in signal strength or distortion. The diode of the present invention may be readily incorporated in a transmission line to form an integral part thereof as shown in FIGURE 3. A typical transmission line is shown comprising an outer conductor 11 and an inner conductor 13 coaxially disposed within the outer conductor. The inner conductor 13 may be non-continuous at the point where it is desired to incorporate a thin film diode, so as to be constituted by two parts or conductors 14 and 16. As shown in FIGURE 3 a thin film 15 of semi-insulator material may be deposited on a surface of one of the inner conductors 16 and in the gap between this conductor and the other inner conductor 14. The exposed surface of the thin film 15 and a surface of the inner conductor 14 are provided with a deposited metallic layer 17 to constitute an electrode connection to the semi-insulator film 15. In this embodiment the inner conductor 16 may be constituted of a metal having a work function lower than the work function of the semi-insulator material while the electrode 17 is constituted by a metal having a higher work function than the work function of the semi-insulator, thereby providing a thin film diode as described previously.

Another embodiment of a transmission line incorporating a thin film diode according to the present invention is shown in FIGURE 4. In this embodiment the inner conductor 13 comprises two parts 14 and 16 which are physically non-continuous with their adjacent ends overlapping. The semi-insulator film 15 in this embodiment is disposed between the inner conductors 14 and 16 at the point where they overlap. By making the inner conductors 14 and 16 of metals having respectively higher and lower work functions with reference to the work function of the semi-insulator, a thin film diode is thereby provided.

There has thus been described an improved asymmetrically conducted device capable of being fabricated in extremely small size and having unique electrical properties.

I claim:

1. A thin film diode device comprising a single crystalline member of semi-insulating material selected from compounds formed by elements of the Second and Third Columns of the Periodic Table with elements of the Sixth and Fifth Columns, respectively; said member being less than twenty microns thick and having a resistivity of at least $10^{+4}$ ohm-centimeters and a predetermined work function; a first electrode in contact with said member and having a work function larger than said predetermined work function; and a second electrode in contact with another portion of said member and having a work function lower than said predetermined work function.

2. The invention according to claim 1 wherein said semi-insulating material is cadmium sulfide.

3. A thin film diode device comprising a first electrode of gold, a second electrode of indium, and a member of cadmium sulfide having a thickness of less than twenty microns and a resistivity of at least $10^{+4}$ ohm-centimeters disposed between said electrodes.

4. In combination, a transmission line having an outer conductor and an inner conductor coaxially disposed therein, a thin film diode device comprising a body of semi-insulating material having a thickness of less than 20 microns and a resistivity of at least $10^4$ ohm-centimeters disposed between separated portions of said inner conductor and electrically coupled thereto by connections having larger and smaller work functions, respectively, than the work function of said body of semi-insulator material.

(References on following page)

References Cited by the Examiner

UNITED STATES PATENTS

| | | | |
|---|---|---|---|
| 2,444,060 | 6/1948 | Ohl | 333—84 |
| 2,844,640 | 7/1958 | Reynolds | 117—200 |
| 2,983,631 | 5/1961 | Hanlet | 117—212 |
| 3,050,689 | 8/1962 | Loach | 330—34 |
| 3,051,844 | 8/1962 | Beam et al. | 333—84 |
| 3,179,854 | 4/1965 | Luedicke et al. | 317—101 |
| 3,183,407 | 5/1965 | Yasuda et al. | 317—101 |
| 3,204,161 | 8/1965 | Witt | 117—235 |

ALFRED L. LEAVITT, *Primary Examiner.*

WILLIAM L. JARVIS, *Examiner.*